(12) United States Patent
Shimizu

(10) Patent No.: US 10,326,402 B2
(45) Date of Patent: Jun. 18, 2019

(54) OSCILLATOR CIRCUIT WITH LOW DROPOUT REGULATOR

(71) Applicant: Synaptics Japan GK, Tokyo (JP)

(72) Inventor: Naoji Shimizu, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 96 days.

(21) Appl. No.: 15/605,481

(22) Filed: May 25, 2017

(65) Prior Publication Data

US 2017/0353156 A1 Dec. 7, 2017

(30) Foreign Application Priority Data

Jun. 3, 2016 (JP) .................................. 2016-111890

(51) Int. Cl.
*H02M 3/07* (2006.01)
*H03B 1/04* (2006.01)
*H03B 5/06* (2006.01)
*H03L 5/00* (2006.01)

(52) U.S. Cl.
CPC ................ *H03B 1/04* (2013.01); *H02M 3/07* (2013.01); *H03B 5/06* (2013.01); *H03L 5/00* (2013.01); *H03B 2200/009* (2013.01); *H03B 2200/0066* (2013.01); *H03B 2200/0088* (2013.01)

(58) Field of Classification Search
CPC ..................................... H03B 5/06; H03B 1/04
See application file for complete search history.

(56) References Cited

U.S. PATENT DOCUMENTS

2009/0146702 A1* 6/2009 Chen ...................... G11C 5/145
327/148
2012/0256693 A1 10/2012 Raghunathan et al.
2014/0084896 A1* 3/2014 Zhang ....................... G05F 1/56
323/311

* cited by examiner

*Primary Examiner* — Jeffrey M Shin
(74) *Attorney, Agent, or Firm* — Patterson + Sheridan, LLP

(57) ABSTRACT

A circuit includes: an oscillator configured to generate an oscillation clock signal; an NMOS transistor having a source connected with a power terminal of the oscillator, and a drain connected with a first power supply line to which a first power supply voltage is supplied; an operational amplifier configured to control a gate voltage of the NMOS transistor based on a voltage of the power terminal of the oscillator; and a charge pump.

The charge pump is configured to use the oscillation clock signal or a clock signal generated from the oscillation clock signal to boost the first power supply voltage and generate a boosted power supply voltage, and to supply the boosted power supply voltage to the power terminal of the operational amplifier.

20 Claims, 15 Drawing Sheets

OSCILLATOR CIRCUIT WITH LOW DROPOUT REGULATOR

CROSS REFERENCE

This application claims priority of Japanese Patent Application No. 2016-111890, filed on Jun. 3, 2016, the disclosure of which is incorporated herein by reference.

TECHNICAL FIELD

The present invention relates to an oscillator circuit.

BACKGROUND ART

The oscillator circuit is one of the circuits which are most widely used in integrated circuits (IC). In recent years, it is desired to generate a signal with a precious oscillation frequency in the stream of high functionalization in the integrated circuit. Therefore, limiting oscillation frequency jitter is an important goal.

One of the factors of generation of the oscillation frequency jitter is power noise. As one technique to restrain generation of the oscillation frequency jitter by the power noise, a technique is known in which an LDO (low dropout regulator) is disposed between the power and an oscillator. For example, such a technique is disclosed in JP 2015-181238A.

FIG. 1 is a circuit diagram illustrating an example of configuration of an oscillator circuit in which the LDO is disposed between the power and the oscillator. An oscillator circuit 100 of FIG. 1 has an oscillator 101 and an LDO 102. The LDO 102 is disposed between a power terminal 101a of the oscillator 101 and a power supply line 103 to which a power supply voltage IOVCC is supplied, to supply the oscillator power supply voltage VDDOSC to the power terminal 101a of the oscillator 101. The LDO 102 has a PMOS transistor 104 and a differential amplifier 105. The PMOS transistor 104 has a source connected with the power supply line 103, and a drain connected with the power terminal 101a of the oscillator 101. The differential amplifier 105 has a non-inverting input (+) connected with the power terminal 101a of the oscillator 101, and an inverting input (−) connected with a reference voltage generation circuit 106. The reference voltage $V_{REF}$ is supplied to the inversion input of the differential amplifier 105 from the reference voltage generation circuit 106. The differential amplifier 105 controls the gate voltage of the PMOS transistor 104 according to a difference between the oscillator power supply voltage VDDOSC and the reference voltage $V_{REF}$.

The oscillator circuit 100 having the configuration of FIG. 1, in which the LDO 102 effectively suppresses propagation of power noise from the power supply line 103 to the oscillator 101, effectively suppresses the oscillation frequency jitter.

According to a study by the inventor, however, there is room in improvement in restraint of the oscillation frequency jitter with respect to the oscillator circuit 100 of FIG. 1.

SUMMARY

Therefore, an objective of the present invention is to provide a technique of restraining oscillation frequency jitter of an oscillator circuit. The other objects of the present invention and new features will be understood by the skilled person from the following disclosure.

In one embodiment, a circuit includes an oscillator which generates an oscillation clock signal, an NMOS transistor, an operational amplifier and a charge pump. The NMOS transistor has a source connected with a power terminal of the oscillator and a drain connected with a power supply line to which a power supply voltage is supplied. The operational amplifier controls a gate voltage of the NMOS transistor according to a voltage of the power terminal of the oscillator. The charge pump is configured to generate a boosted power supply voltage through boosting the first power supply voltage by using the oscillation clock signal or a clock signal generated from the oscillation clock signal, and supply the boosted power supply voltage to the power terminal of the operational amplifier. Another embodiment described herein is an integrated circuit that includes the circuit described above.

According to the present invention, the oscillation frequency jitter of the oscillator circuit can be suppressed.

DETAILED DESCRIPTION OF PREFERRED EMBODIMENTS

Hereinafter, embodiments will be described with reference to the attached drawings. Note that in the following description, same or corresponding components may be denoted by same or corresponding reference numbers.

(First Embodiment)

Figure 2:
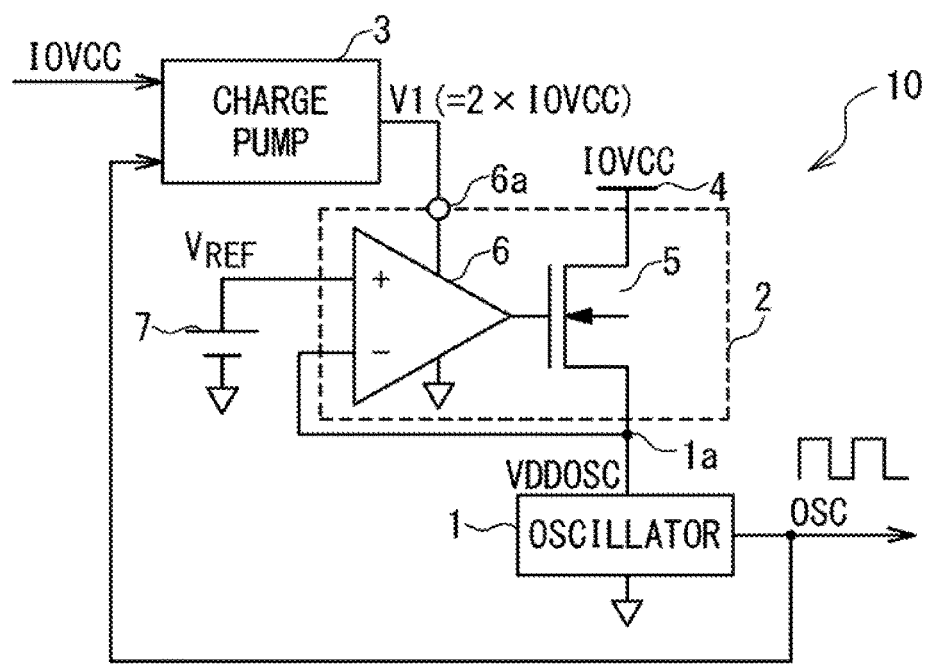
FIG. 2 is a circuit diagram illustrating a configuration of an oscillator circuit in a first embodiment.

FIG. 2 is a circuit diagram illustrating a configuration of an oscillator circuit 10 in a first embodiment. The oscillator circuit 10 includes an oscillator 1, an LDO (low dropout regulator) 2 and a charge pump 3.

The oscillator 1 operates based on an oscillator power supply voltage VDDOSC supplied to a power terminal 1a to generate an oscillation clock signal OSC.

The LDO 2 is provided between a power supply line 4 to which a power supply voltage IOVCC is supplied and the power terminal 1a of the oscillator 1 and is configured to supply the oscillator power supply voltage VDDOSC to the power terminal 1a. In the present embodiment, the LDO 2 includes the NMOS transistor 5 and an operational amplifier 6. Of the NMOS transistor 5, a drain is connected with the power supply line 4, and a source is connected with the power terminal 1a of the oscillator 1. Of the operational amplifier 6, an inversion input (−) is connected with the power terminal 1a of the oscillator 1, and a non-inversion input (+) is connected with a reference voltage generation circuit 7. A reference voltage $V_{REF}$ is supplied from the reference voltage generation circuit 7 to the non-inversion input of the operational amplifier 6. An output of the operational amplifier 6 is connected with a gate of the NMOS transistor 5. The operational amplifier 6 controls the gate voltage of the NMOS transistor 5 according to the oscillator power supply voltage VDDOSC which is supplied to the power terminal 1a. The gate voltage of the NMOS transistor 5 is controlled in such a manner that the oscillator power supply voltage VDDOSC becomes equal to a desired voltage, i.e., the reference voltage $V_{REF}$ in the present embodiment. In detail, in the present embodiment, the output voltage of the operational amplifier 6, i.e. the gate voltage of the NMOS transistor 5 is controlled according to a difference between the reference voltage $V_{REF}$ and the oscillator power supply voltage VDDOSC. Thus, the control is carried out such that the oscillator power supply voltage VDDOSC becomes equal to the reference voltage $V_{REF}$.

Note that the LDO 2 configures a source follower using the NMOS transistor 5. As discussed later in detail, such a configuration further stabilizes the oscillator power supply voltage VDDOSC, and is effective at limiting jitter at the oscillation frequency of the oscillator circuit 10.

The charge pump 3 boosts the power supply voltage IOVCC and generates the boosted power supply voltage V1 higher in a voltage level than the power supply voltage IOVCC. An oscillation clock signal OSC generated by the oscillator 1 is supplied to the charge pump 3. The charge pump 3 boosts the power supply voltage IOVCC by using the oscillation clock signal OSC. The boosted power supply voltage V1 generated by the charge pump 3 is supplied to a power terminal 6a of the operational amplifier 6. The operational amplifier 6 operates based on the boosted power supply voltage V1.

Figure 3:
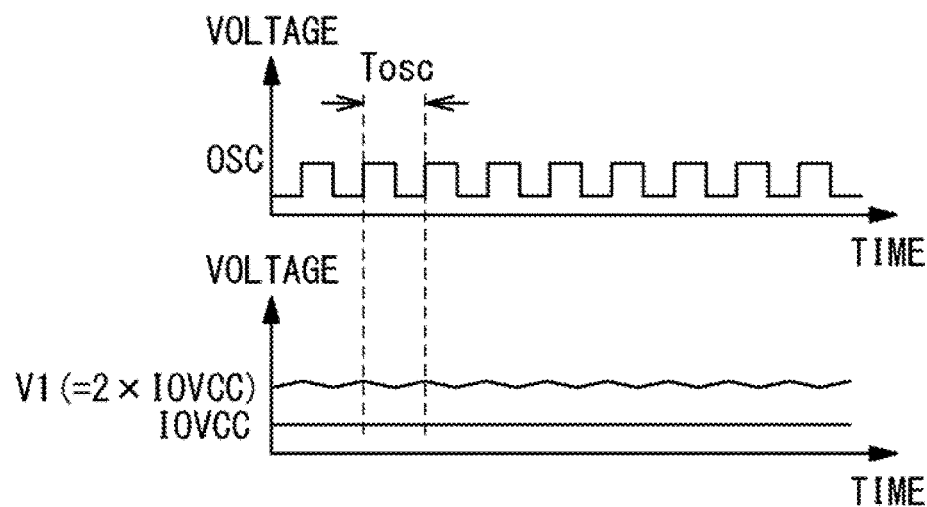
FIG. 3 is a timing chart illustrating an example of the operation of a charge pump.

FIG. 3 is a timing chart illustrating an example of the operation of the charge pump 3. In FIG. 3, one period of the oscillation clock signal OSC is shown by a symbol "$T_{osc}$". In the present embodiment, the charge pump 3 carries out charging and discharging of a boosting capacitor (not illustrated) in each period of the oscillation clock signal OSC, and generates the boosted power supply voltage V1 such that the boosted power supply voltage V1 has almost twice the power supply voltage IOVCC.

In the oscillator circuit 10 with the above-mentioned configuration, since the LDO 2 is provided between the power supply line 4 and the power terminal 1a of the oscillator 1, the propagation to the oscillator 1 of power noise which occurs in the power supply line 4 is restrained. Thus, in the oscillator circuit 10 of the present embodiment, the oscillation frequency jitter is restrained and the oscillation frequency can be stabilized.

In this case, in the present embodiment, since the LDO 2 is configured as the source follower using the NMOS transistor 5, the oscillator power supply voltage VDDOSC is further stabilized. Thus, the stabilization of the oscillation frequency is achieved. For example, when the oscillator power supply voltage VDDOSC decreases, the voltage between the gate and the source in the NMOS transistor 5 increases automatically. When the voltage between the gate and the source in the NMOS transistor 5 increases, the current which flows into the power terminal 1a of the oscillator 1 increases, and then the voltage of the power terminal 1a of the oscillator 1, i.e., the oscillator power supply voltage VDDOSC increases. Thus, the state returns to its original state. Oppositely, when the oscillator power supply voltage VDDOSC is increased, the voltage between the gate and the source of the NMOS transistor 5 decreases automatically, so that the current which flows into the power terminal 1a of the oscillator 1 decreases. When the current which flows into the power terminal 1a of the oscillator 1 decreases, the oscillator power supply voltage VDDOSC decreases. Thus, the state returns to the original state. In this way, in the configuration of the oscillator circuit 10 of the present embodiment, since the voltage between the gate and the source in the NMOS transistor 5 is automatically controlled to compensate the change of the oscillator power supply voltage VDDOSC, the oscillator power supply voltage VDDOSC is further stabilized. This contributes to the stabilization of the oscillation frequency.

Note that in order to make the NMOS transistor 5 stably operate in the configuration of FIG. 2, in one embodiment the gate voltage of the NMOS transistor 5 is higher than a summation of a desired voltage level of the oscillator power supply voltage VDDOSC and a threshold voltage $V_{TH}$ of the NMOS transistor 5. To realize such an operation, in the oscillator circuit 10 of the present embodiment, the operational amplifier 6 is configured to operate based on the boosted power supply voltage V1 generated by the charge pump 3. By generating, by the charge pump 3, the boosted power supply voltage V1 which has a sufficiently higher voltage level than the power supply voltage IOVCC (typically, twice of power supply voltage IOVCC), the output voltage of the operational amplifier 6, i.e., the gate voltage of the NMOS transistor 5 can be kept higher than the summation of the desired voltage level of the oscillator power supply voltage VDDOSC and the threshold voltage $V_{TH}$ of the NMOS transistor 5.

Moreover, in the present embodiment, note that it is not necessary to supply a clock signal from an external circuit to the charge pump 3, since the charge pump 3 is configured to operate in response to the oscillation clock signal OSC generated by the oscillator 1. This contributes to restraint of the increase of the circuit scale of the oscillator circuit 10.

(Second Embodiment)

Figure 1:
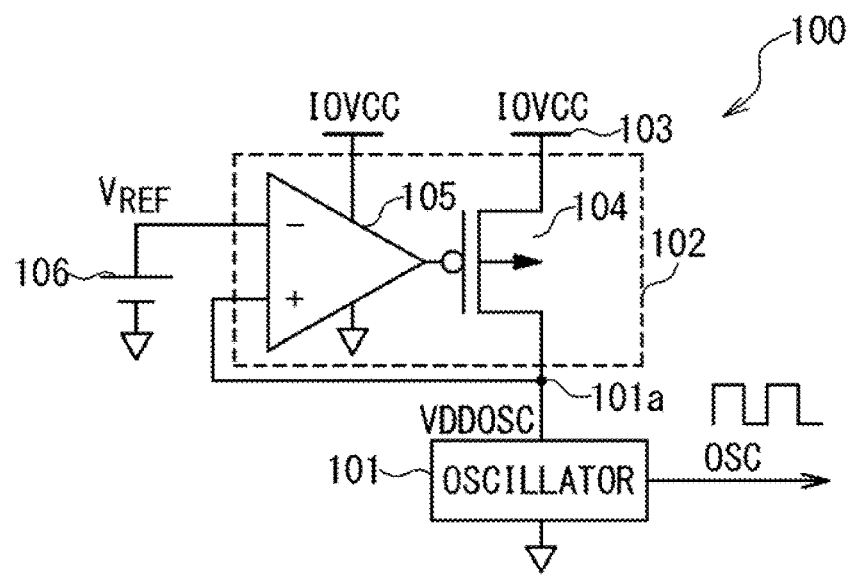
FIG. 1 is a circuit diagram illustrating an example of a configuration of an oscillator circuit in which an LDO is provided.
Figure 4:
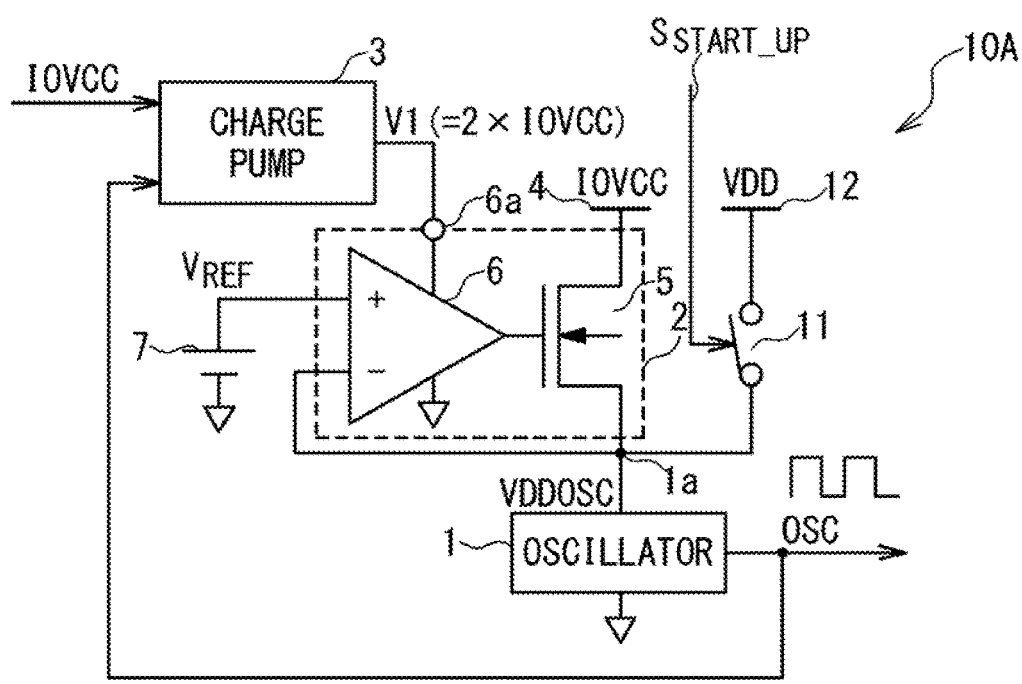
FIG. 4 is a circuit diagram illustrating a configuration of the oscillator circuit in a second embodiment.

FIG. 4 is a circuit diagram illustrating the configuration of an oscillator circuit 10A in the second embodiment. The oscillator circuit 10A in the second embodiment has almost the same configuration as the oscillator circuit 10 in the first embodiment shown in FIG. 1. However, in the oscillator circuit 10A in the second embodiment, a switch 11 is additionally provided to be connected between the power supply line 12 supplied with a power supply voltage VDD and the power terminal 1a of the oscillator 1. The switch 11 is configured to carry out a switching operation in response to a start signal $S_{START\_UP}$. In the present embodiment, the switch 11 is turned on when the start signal $S_{START\_UP}$ is asserted and is turned off when negated.

The switch 11 is provided to stabilize the start-up of the oscillator circuit 10A. In the operation of the oscillator circuit 10A in the present embodiment, since the oscillation clock signal OSC generated by the oscillator 1 is used for the voltage boosting operation by the charge pump 3, in one embodiment the oscillator 1 quickly starts the operation upon the start-up of the oscillator circuit 10A in order to stably start up the charge pump 3. The switch 11 is used to quickly start the operation of the oscillator 1 upon the start-up of the oscillator circuit 10A.

Below, the procedure of start-up of the oscillator circuit 10A in the present embodiment will be described in detail.

In case of start-up of the oscillator circuit 10A, the start signal $S_{START\_UP}$ is asserted and the switch 11 is turned on. When the switch 11 is turned on, the power supply voltage VDD is supplied to the power terminal 1a of the oscillator 1 from the power supply line 12, and the oscillator 1 starts the operation to generate the oscillation clock signal OSC, by using the power supply voltage VDD as the oscillator power supply voltage VDDOSC. The oscillation clock signal OSC generated by the oscillator 1 is supplied to the charge pump 3.

When the supply of the oscillation clock signal OSC to the charge pump 3 is started, the charge pump 3 starts the voltage boosting operation so that the voltage level of the boosted power supply voltage V1 supplied to the power terminal 6a of the operational amplifier 6 begins to rise. When the voltage level of the boosted power supply voltage V1 rises sufficiently, the operational amplifier 6 starts the operation based on the boosted power supply voltage V1, to start the control of the gate voltage of the NMOS transistor 5. Thus, the operation begins to stabilize the oscillator power supply voltage VDDOSC by the LDO 2.

After that, the switch 11 is turned off and the start-up of the oscillator circuit 10A completes. After the switch 11 is turned off, the oscillator power supply voltage VDDOSC is controlled to a desired voltage (e.g. the reference voltage $V_{REF}$) by the operation of the operational amplifier 6. The oscillator circuit 10A carries out the operation of generating the oscillation clock signal OSC while restraining the oscillation frequency jitter.

In one embodiment, the switch 11 is turned off after the voltage level of the boosted power supply voltage V1 supplied to the power terminal 6a of the operational amplifier is sufficiently raised. To carry out such an operation surely, it may be desirable to monitor the voltage level of the boosted power supply voltage V1 and to turn off the switch 11 according to the voltage level of the boosted power supply voltage V1.

Figure 5:
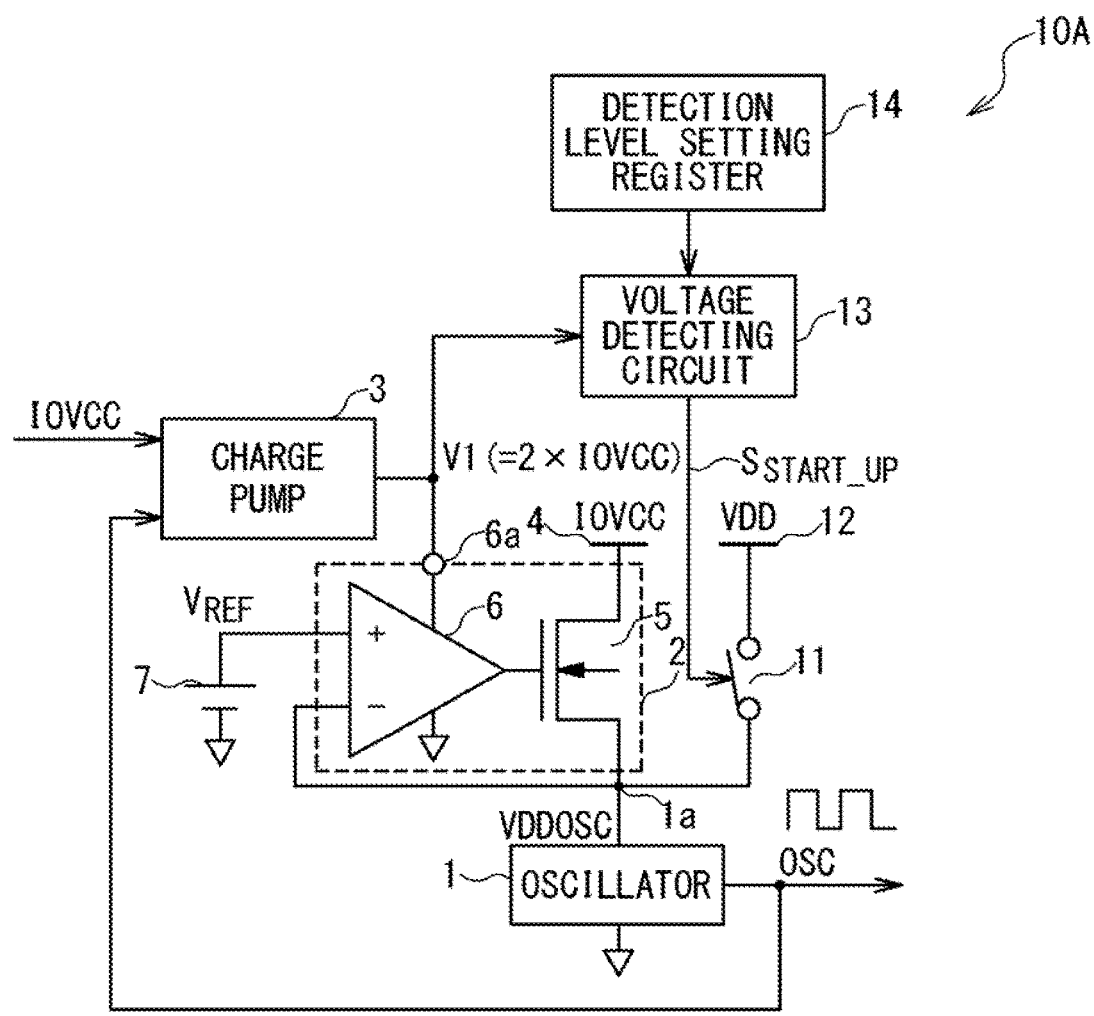
FIG. 5 is a circuit diagram illustrating another configuration of the oscillator circuit in the second embodiment.

FIG. 5 is a circuit diagram illustrating the configuration of the oscillator circuit 10A which is configured to monitor the voltage level of the boosted power supply voltage V1. The oscillator circuit 10A in FIG. 5 includes a voltage detecting circuit 13 and a detection level setting register 14. The voltage detecting circuit 13 and the detection level setting register 14 configure a controller which generates the start signal $S_{START\_UP}$ according to the voltage level of the boosted power supply voltage V1. The voltage detecting circuit 13 detects the voltage level of the boosted power supply voltage V1. The voltage detecting circuit 13 asserts the start signal $S_{START\_UP}$, when the voltage level of the boosted power supply voltage V1 is lower than a predetermined detection level, and negates the start signal $S_{START\_UP}$ when being higher than the predetermined detection level. The detection level setting register 14 holds a register value for specifying the detection level.

The oscillator circuit 10A in FIG. 5 operates as follows. At the time of start-up of the oscillator circuit 10A, the voltage level of the power terminal 6a of the operational amplifier 6 is a ground level or a voltage level near the ground level. Therefore, the voltage detecting circuit 13 asserts the start signal $S_{START\_UP}$. When the switch 11 is turned on in response to the assertion of the start signal $S_{START\_UP}$, the power supply voltage VDD is supplied to the power terminal 1a of the oscillator 1, and the oscillator 1 starts the operation of generating the oscillation clock signal OSC, by using the power supply voltage VDD as the oscillator power supply voltage VDDOSC. When the supply of the oscillation clock signal OSC to the charge pump 3 is started, the charge pump 3 starts the voltage boosting operation so that the voltage of the power terminal 6a of the operational amplifier 6, i.e. the boosted power supply voltage V1 begins to rise. When the voltage level of the boosted power supply voltage V1 exceeds the detection level which is set in the detection level setting register 14, the voltage detecting circuit 13 negates the start signal $S_{START\_UP}$ to turn off the switch 11. In this way, the start-up of the oscillator circuit 10A of FIG. 5 completes.

According to such an operation, since the switch 11 is turned off after the voltage level of the boosted power supply voltage V1 supplied to the power terminal 6a of the operational amplifier 6 rises sufficiently, the oscillator circuit 10A can be stably started up.

Figure 6:
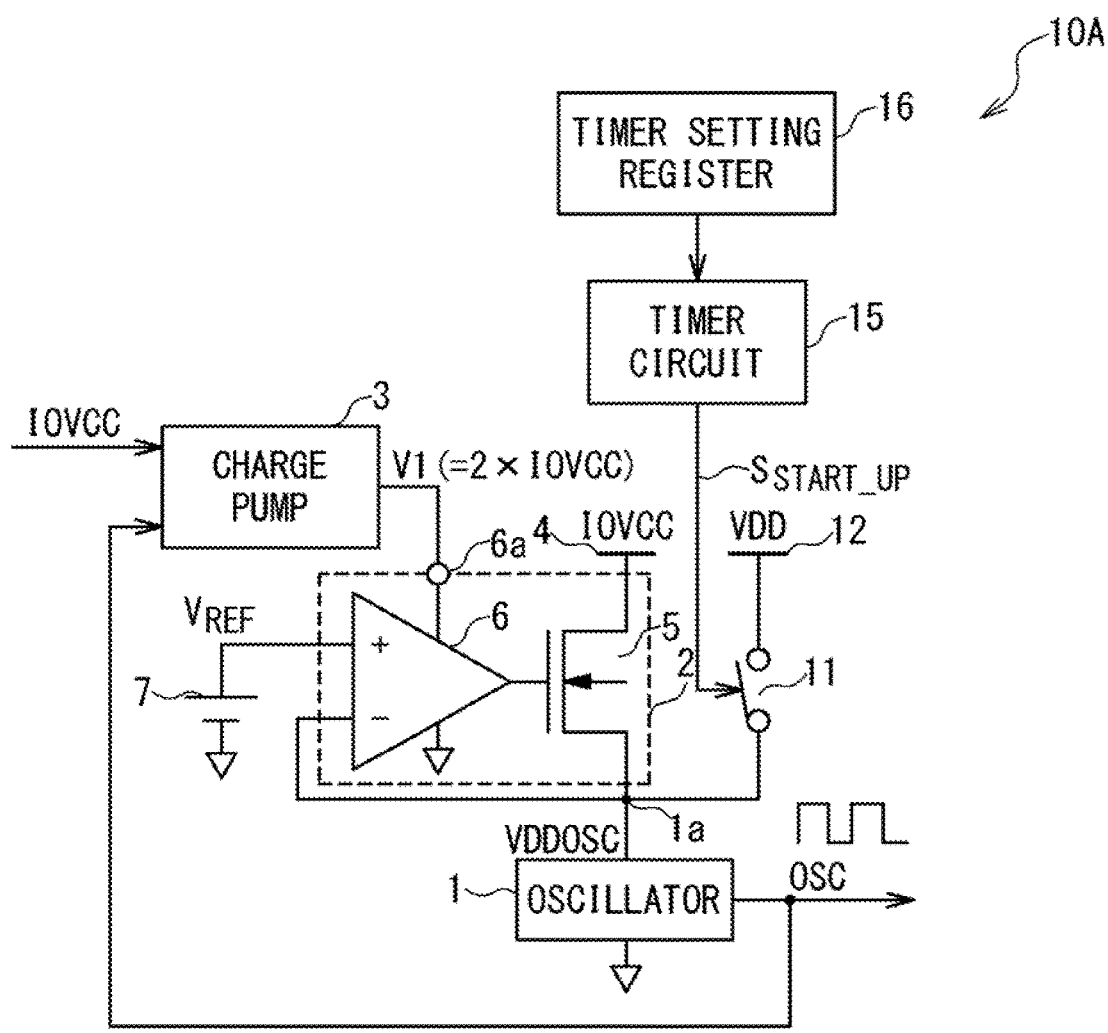
FIG. 6 is a circuit diagram illustrating still another configuration of the oscillator circuit in the second embodiment.

In another example, a time counting operation is carried out by a timer circuit, the switch 11 may be turned off at the timing when it is estimated that the voltage level of the boosted power supply voltage V1 supplied to the power terminal 6a of the operational amplifier 6 has been sufficiently raised. FIG. 6 is a circuit diagram illustrating the configuration of the oscillator circuit 10A of such a configuration. The oscillator circuit 10A of FIG. 6 includes a timer circuit 15 and a timer setting register 16. The timer setting register 16 holds a register value used to set the elapsed time to be detected by the time counting operation by the timer circuit 15.

The oscillator circuit 10A of FIG. 6 operates as follows. The timer circuit 15 asserts the start signal $S_{START\_UP}$ to turn on the switch 11 and to start the time counting operation, when an integrated circuit containing the oscillator circuit 10A is started (for example, when the power of the integrated circuit is turned on, or the integrated circuit is reset). When the switch 11 is turned on, the oscillator 1 and the charge pump 3 start the operations so that the boosted power supply voltage V1 begins to rise. This operation is as mentioned above. Moreover, when the time specified by the register value of the timer setting register 16 has elapsed from the start of the time counting operation, the timer circuit 15 negates the start signal $S_{START\_UP}$ to turn off the switch 11. Thus, the start-up of the oscillator circuit 10A of FIG. 6 completes. After the switch 11 is turned off, the oscillator power supply voltage VDDOSC is controlled to the desired voltage (e.g. the reference voltage $V_{REF}$) by the operation of the operational amplifier 6.

In such an operation, the oscillator circuit 10A can be stably started up, by determining the elapsed time specified by the register value of the timer setting register 16 so that the switch 11 is turned off at the timing when it is estimated that the voltage level of the boosted power supply voltage V1 supplied to the power terminal 6a of the operational amplifier 6 has been sufficiently raised.

(Third Embodiment)

Figure 7:
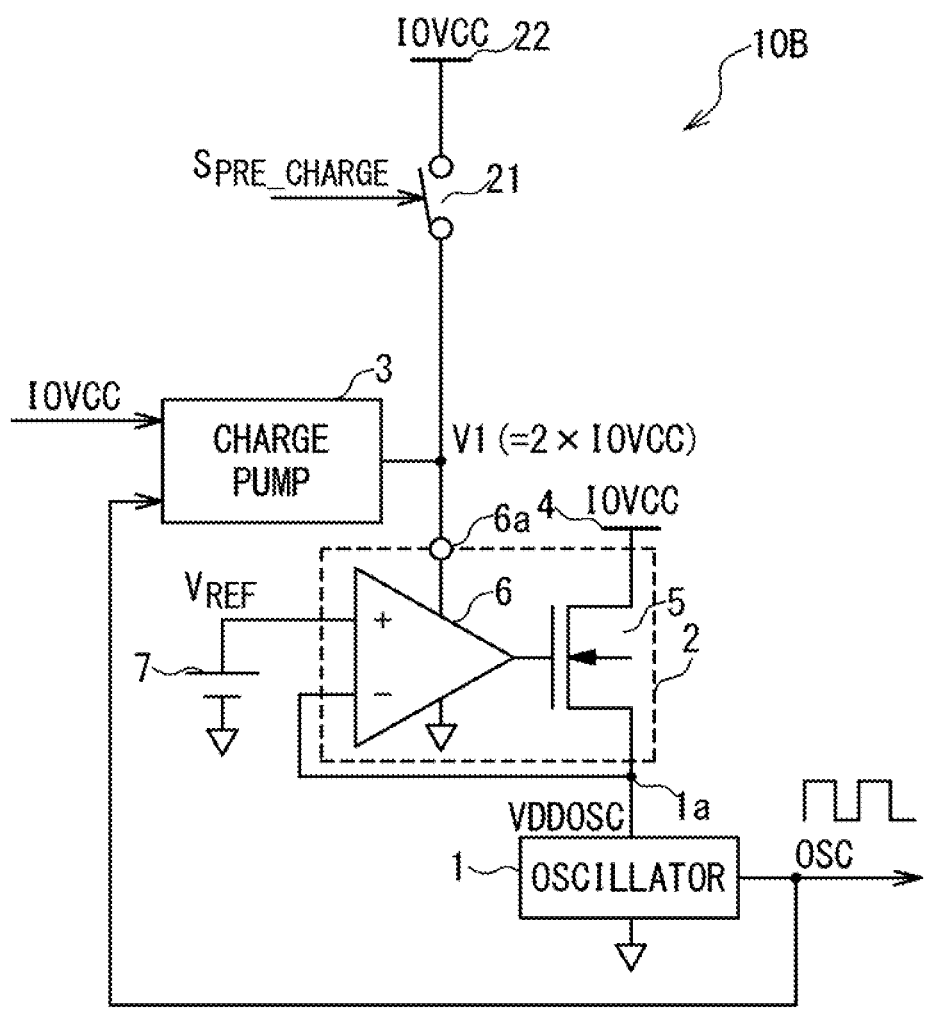
FIG. 7 is a circuit diagram illustrating a configuration of the oscillator circuit in a third embodiment.

FIG. 7 is a circuit diagram illustrating the configuration of the oscillator circuit 10B in a third embodiment. The oscillator circuit 10B in the second embodiment is configured in almost the same way as the oscillator circuit 10 in the first embodiment shown in FIG. 1. However, in the oscillator circuit 10B in the third embodiment, a switch 21 is additionally provided between a power supply line 22 supplied with the power supply voltage IOVCC and the power terminal 6a of the operational amplifier 6. The switch 21 is configured to carry out a switching operation in response to a precharge signal $S_{PRE\_CHARGE}$. In the present embodiment, the switch 21 is turned on when the precharge signal $S_{PRE\_CHARGE}$ is asserted and is turned off when negated.

The switch 21 is provided to stabilize the start-up of the oscillator circuit 10B. In the oscillator circuit 10B in the present embodiment, to start the operation of the oscillator 1, it may be necessary that the oscillator power supply voltage VDDOSC having the voltage level at which the oscillator 1 is operable is generated in the power terminal 1a. For this reason, in one embodiment the operation of the operational amplifier 6 is quickly started. The switch 21 is used to make the operational amplifier 6 quickly start the operation upon start-up of the oscillator circuit 10B.

Below, the procedure of the start-up of the oscillator circuit 10B in the present embodiment will be described in detail.

Upon start-up of the oscillator circuit 10B, the precharge signal $S_{PRE\_CHARGE}$ is asserted to turn on the switch 21.

When the switch 21 is turned on, the power supply voltage IOVCC is supplied to the power terminal 6a of the operational amplifier 6. Thus, the operation of the operational amplifier 6 is started. To optimally control the gate voltage of the NMOS transistor 5, the power supply voltage which is higher than power supply voltage IOVCC is supplied to the operational amplifier 6. However, if the power supply voltage IOVCC is supplied to the power terminal 6a of the operational amplifier 6, the operational amplifier 6 can output the gate voltage at which the NMOS transistor 5 is operable.

When the operational amplifier 6 starts its operation, the NMOS transistor 5 also operates to generate the oscillator power supply voltage VDDOSC having a voltage level at which the oscillator 1 is operable, in the power terminal 1a of the oscillator 1. Thus, the oscillator 1 starts the operation of generating the oscillation clock signal OSC. The oscillation clock signal OSC generated by the oscillator 1 is supplied to the charge pump 3.

In one embodiment, when the supply of the oscillation clock signal OSC to the charge pump 3 is started, the charge pump 3 starts the voltage boosting operation so that the voltage level of the boosted power supply voltage V1 supplied to the power terminal 6a of the operational amplifier 6 begins to rise. After the voltage level of the boosted power supply voltage V1 is sufficiently raised, the operational amplifier 6 controls the gate voltage of the NMOS transistor 5 according to the oscillator power supply voltage VDDOSC optimally. Thus, the oscillator power supply voltage VDDOSC is stabilized.

After that, the switch 21 is turned off and the start-up of the oscillator circuit 10B completes. After the switch 21 is turned off, the operational amplifier 6 operates based on the boosted power supply voltage V1 which can have a sufficiently high voltage level, so as to control the oscillator power supply voltage VDDOSC to the desired voltage (e.g. the reference voltage $V_{REF}$) by the operation of the operational amplifier 6. Thus, the oscillator circuit 10B operates to generate the oscillation clock signal OSC while restraining the oscillation frequency jitter.

In one embodiment, the switch 21 is turned off after the voltage level of the boosted power supply voltage V1 supplied to the power terminal 6a of the operational amplifier 6 rises sufficiently. To carry out such an operation surely, the voltage level of the boosted power supply voltage V1 is detected, and the switch 11 is turned off according to the voltage level of boosted power supply voltage V1.

Figure 8:
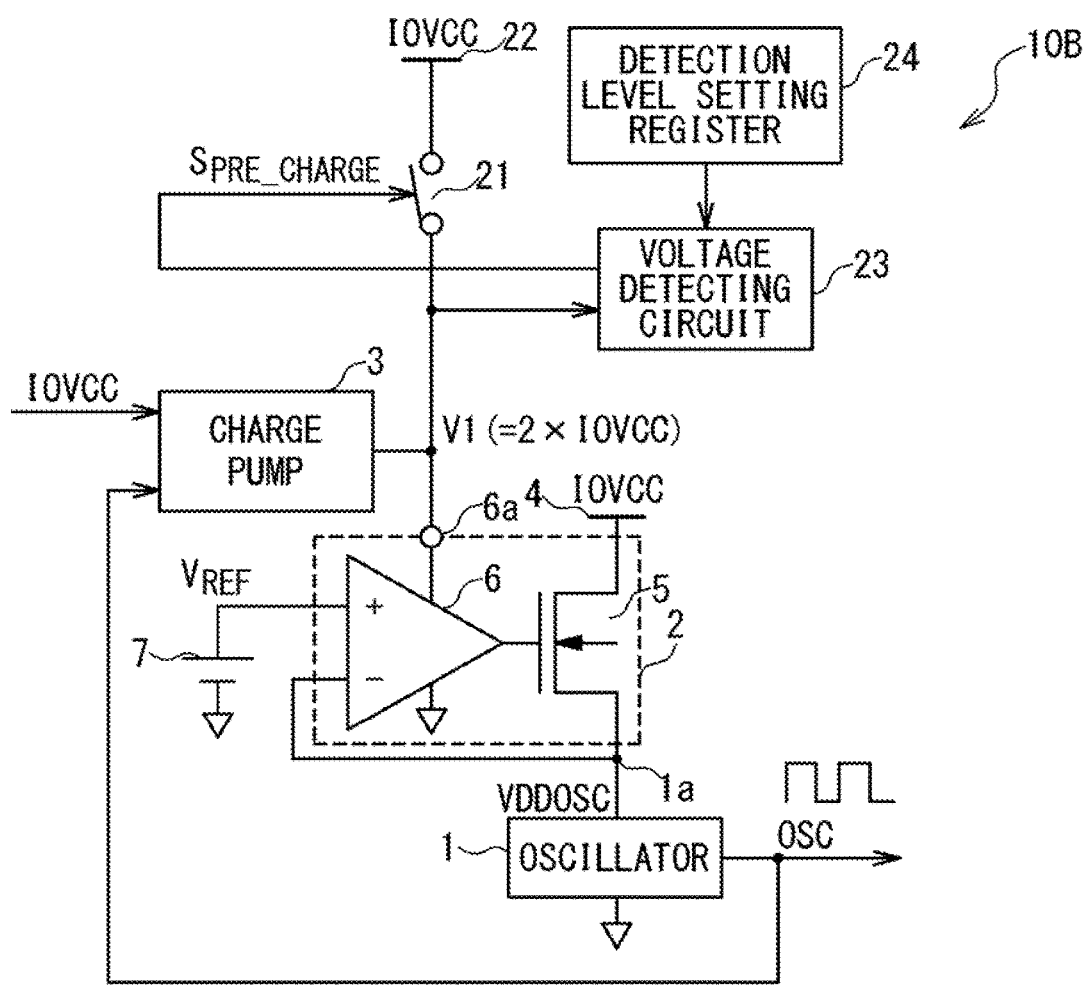
FIG. 8 is a circuit diagram illustrating another configuration of the oscillator circuit in the third embodiment.

FIG. 8 is a circuit diagram illustrating the configuration of the oscillator circuit 10B which monitors the voltage level of the boosted power supply voltage V1. The oscillator circuit 10B of FIG. 8 has a voltage detecting circuit 23 and a detection level setting register 24. The voltage detecting circuit 23 and the detection level setting register 24 configures a controller which generates a precharge signal $S_{PRE\_CHARGE}$ according to the voltage level of the boosted power supply voltage V1. The voltage detecting circuit 23 detects the voltage level of the boosted power supply voltage V1. The voltage detecting circuit 23 asserts the precharge signal $S_{PRE\_CHARGE}$, when the voltage level of the boosted power supply voltage V1 is lower than a predetermined detection level, and negates the precharge signal $S_{PRE\_CHARGE}$, when higher than the predetermined detection level. The detection level setting register 24 holds a register value for specifying the detection level.

The oscillator circuit 10B of FIG. 8 operates as follows. The voltage level of the power terminal 6a of the operational amplifier 6 is in a ground level or a voltage level near the ground level at the timing when the oscillator circuit 10B is started up. The voltage detecting circuit 23 asserts the precharge signal $S_{PRE\_CHARGE}$. When the switch 21 is turned on in response to the assertion of the precharge signal $S_{PRE\_CHARGE}$, the power supply voltage IOVCC is supplied to the power terminal 6a of the operational amplifier 6. Thus, the operation of the operational amplifier 6 is started. Also, the NMOS transistor 5 operates in response to the start of operation of the operational amplifier 6. In the power terminal 1a of the oscillator 1, the oscillator power supply voltage VDDOSC is generated which is the voltage level possible for the oscillator 1 to operate. Thus, the oscillator 1 starts the operation of generating the oscillation clock signal OSC. When the supply of the oscillation clock signal OSC to the charge pump 3 is started, the charge pump 3 starts the voltage boosting operation. As a result, the voltage of the power terminal 6a of the operational amplifier 6, i.e. the boosted power supply voltage V1 begins to rise further. When the voltage level of the boosted power supply voltage V1 exceeds the detection level set to the detection level setting register 24, the voltage detecting circuit 23 negates the precharge signal $S_{PRE\_CHARGE}$ to turn off the switch 21. The start-up of the oscillator circuit 10B completes as described above.

According to such an operation, since the switch 21 is turned off after the voltage level of the boosted power supply voltage V1 supplied to the power terminal 6a of the operational amplifier 6 rises sufficiently, the oscillator circuit 10B can be stably started up.

Figure 9:
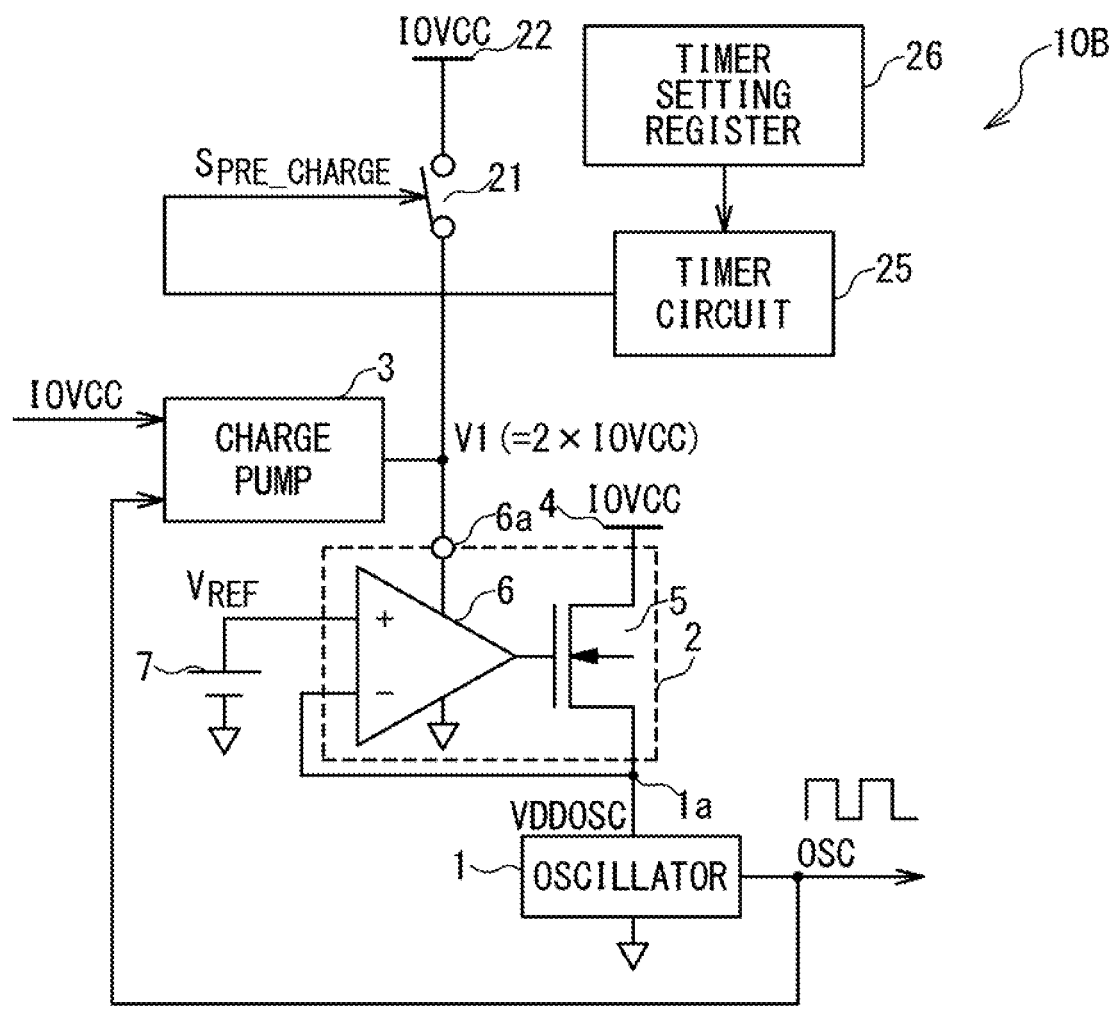
FIG. 9 is a circuit diagram illustrating another configuration of the oscillator circuit in the third embodiment more.

In another example, the time counting operation may be carried out by a timer circuit, and the switch 21 may be turned off at timing when the voltage level of the boosted power supply voltage V1 supplied to the power terminal 6a of the operational amplifier 6 is expected to be sufficiently raised. FIG. 9 is a circuit diagram illustrating the configuration of the oscillator circuit 10B of such a configuration. The oscillator circuit 10B of FIG. 9 has a timer circuit 25 and a timer setting register 26. The timer setting register 26 has a register value used to set an elapsed time to be detected through the time counting operation by the timer circuit 25.

The oscillator circuit 10B of FIG. 9 operates as follows. When the start-up of an integrated circuit which contains the oscillator circuit 10B is started (for example, when the power of the integrated circuit is turned on or the integrated circuit is reset), the timer circuit 25 asserts the precharge signal $S_{PRE\_CHARGE}$ to turn on the switch 21, and starts the time counting operation. It is as mentioned above that the operational amplifier 6, the NMOS transistor 5, the oscillator 1 and the charge pump 3 start the operations to begin to raise the boosted power supply voltage V1, when the switch 21 is turned on. Moreover, when the elapsed time specified by the register value of the timer setting register 16 from the start of the time counting operation elapses, the timer circuit 25 negates the precharge signal $S_{PRE\_CHARGE}$ to turn off the switch 21. The start-up of the oscillator circuit 10B completes as described above.

In such an operation, the oscillator circuit 10B can be stably started up since the elapsed time specified by the register value of the timer setting register 26 is set so that the switch 21 is turned off when it is assumed that the voltage level of the boosted power supply voltage V1 supplied to the power terminal 6a of the operational amplifier 6 is sufficiently raised.

(Fourth Embodiment)

Figure 10:
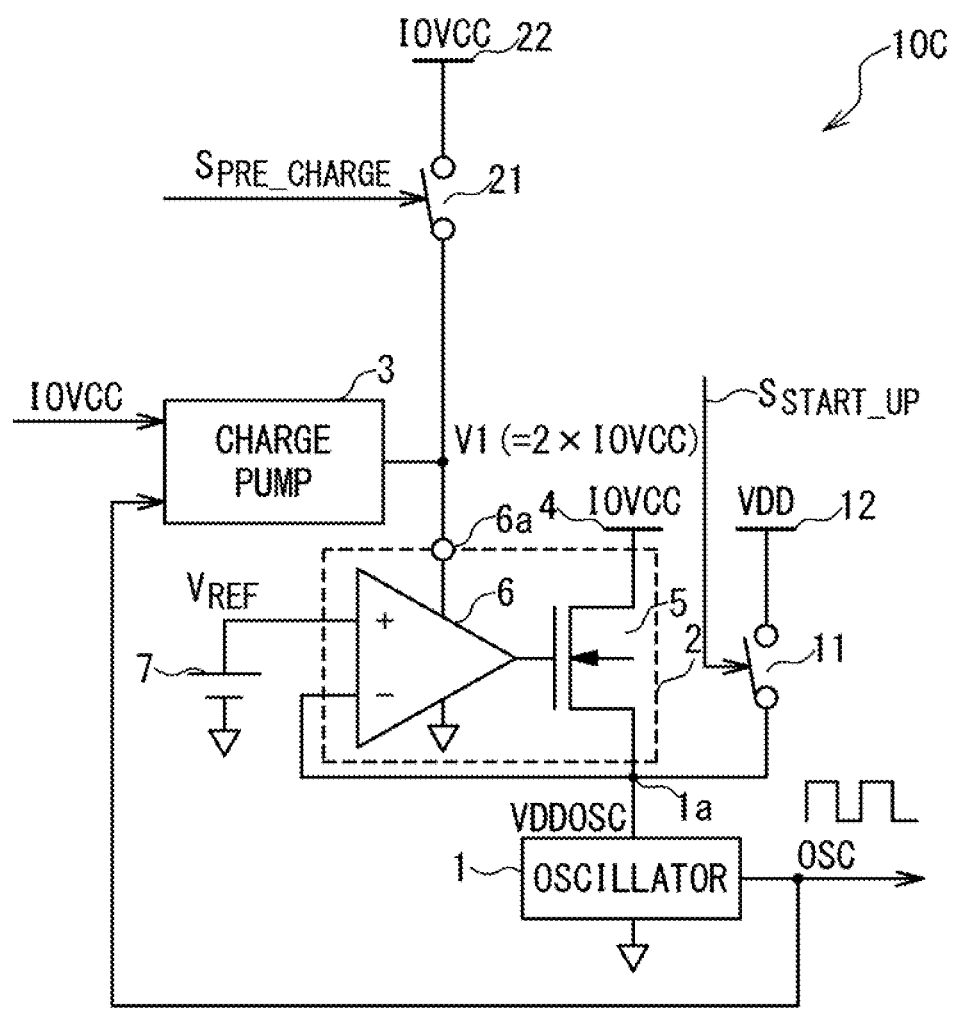
FIG. 10 is a circuit diagram illustrating a configuration of the oscillator circuit in a fourth embodiment.

FIG. 10 is a circuit diagram illustrating the configuration of an oscillator circuit 10C in the fourth embodiment. In the fourth embodiment, both of the switch 11 for supplying the power supply voltage VDD to the power terminal 1a of the oscillator 1 and the switch 21 for supplying the power supply voltage IOVCC to the power terminal 6a of the operational amplifier 6 are provided in the oscillator circuit 10C.

The oscillator circuit 10C of FIG. 10 operates as follows. Upon the start-up of the oscillator circuit 10C, the start signal $S_{START\_UP}$ and the precharge signal $S_{PRE\_CHARGE}$ are asserted to turn on the switches 11 and 21. The switches 11 and 21 are turned on so that the oscillator 1, the NMOS transistor 5, and the operational amplifier 6 start the operations to generate the oscillation clock signal OSC. The generated oscillation clock signal OSC is supplied to the charge pump 3. When the supply of the oscillation clock signal OSC to the charge pump 3 is started, the charge pump 3 starts the voltage boosting operation and the voltage level of the boosted power supply voltage V1 supplied to the power terminal 6a of the operational amplifier 6 begins to rise. When the voltage level of the boosted power supply voltage V1 is sufficiently raised, the operational amplifier 6 starts the operation based on the boosted power supply voltage V1 to start the control of the gate voltage of the NMOS transistor 5. Thus, the operation of stabilizing the oscillator power supply voltage VDDOSC by the LDO 2 is started. After that, the switches 11 and 21 are turned off and the start-up of the oscillator circuit 10C completes.

In the oscillator circuit 10C of FIG. 10, the switches 11 and 21 are turned on when the start-up of the oscillator circuit 10C is started. The switches 11 and 21 are turned off when the voltage level of the boosted power supply voltage V1 is expected to be sufficiently raised, and the oscillator circuit 10C can be stably started up.

Figure 11:
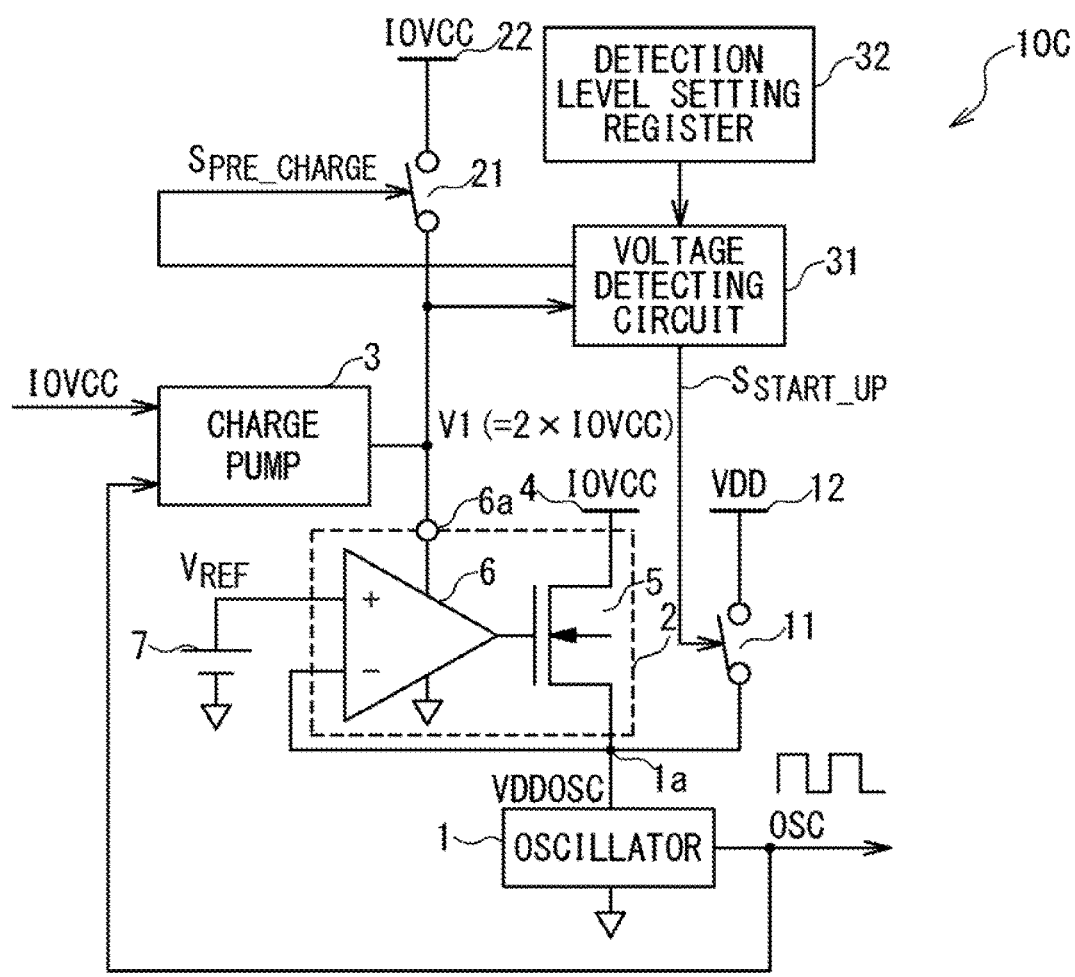
FIG. 11 is a circuit diagram illustrating another configuration of the oscillator circuit of the fourth embodiment.

As understood from the second and third embodiments, the switches 11 and 21 are controlled according to the voltage level of the boosted power supply voltage V1. FIG. 11 is a circuit diagram illustrating the configuration of the oscillator circuit 10C when the switches 11 and 21 are controlled according to the voltage level of the boosted power supply voltage V1. The oscillator circuit 10C of FIG. 11 has a voltage detecting circuit 31 and a detection level setting register 32. The voltage detecting circuit 31 and the detection level setting register 32 configure a controller that generates the start signal $S_{START\_UP}$ and the precharge signal $S_{PRE\_CHARGE}$ according to the voltage level of the boosted power supply voltage V1. The voltage detecting circuit 31 detects the voltage level of the boosted power supply voltage V1. The voltage detecting circuit 31 asserts the start signal $S_{START\_UP}$ and the precharge signal $S_{PRE\_CHARGE}$ when the voltage level of the boosted power supply voltage V1 is lower than a predetermined detection level, and negates the start signal $S_{START\_UP}$ and the precharge signal $S_{PRE\_CHARGE}$ when the voltage level of the boosted power supply voltage V1 is higher than the detection level. The detection level setting register 32 holds a register value for specifying the detection level.

The oscillator circuit 10C of FIG. 11 operates as follows. Upon the start-up of the oscillator circuit 10C, since the voltage level of the boosted power supply voltage V1 is low, the start signal $S_{START\_UP}$ and the precharge signal $S_{PRE\_CHARGE}$ are asserted and the switches 11 and 21 are turned on. Since the switches 11 and 21 are turned on, the oscillator 1, the NMOS transistor 5, and the operational amplifier 6 start the operations to generate the oscillation clock signal OSC. The generated oscillation clock signal OSC is supplied to the charge pump 3. When the supply of the oscillation clock signal OSC to the charge pump 3 is started, the charge pump 3 starts the voltage boosting operation and the voltage level of the boosted power supply voltage V1 supplied to the power terminal 6a of the operational amplifier 6 begins to rise. When the voltage level of the boosted power supply voltage V1 is sufficiently raised, the operational amplifier 6 starts the operation based on the boosted power supply voltage V1 and starts the control of the gate voltage of the NMOS transistor 5. Thus, the operation of stabilizing the oscillator power supply voltage VDDOSC by the LDO 2 is started. After that, when the voltage level of the boosted power supply voltage V1 becomes higher than the predetermined detection level, the switches 11 and 21 are turned off and the start-up of the oscillator circuit 10A completes.

Figure 12:
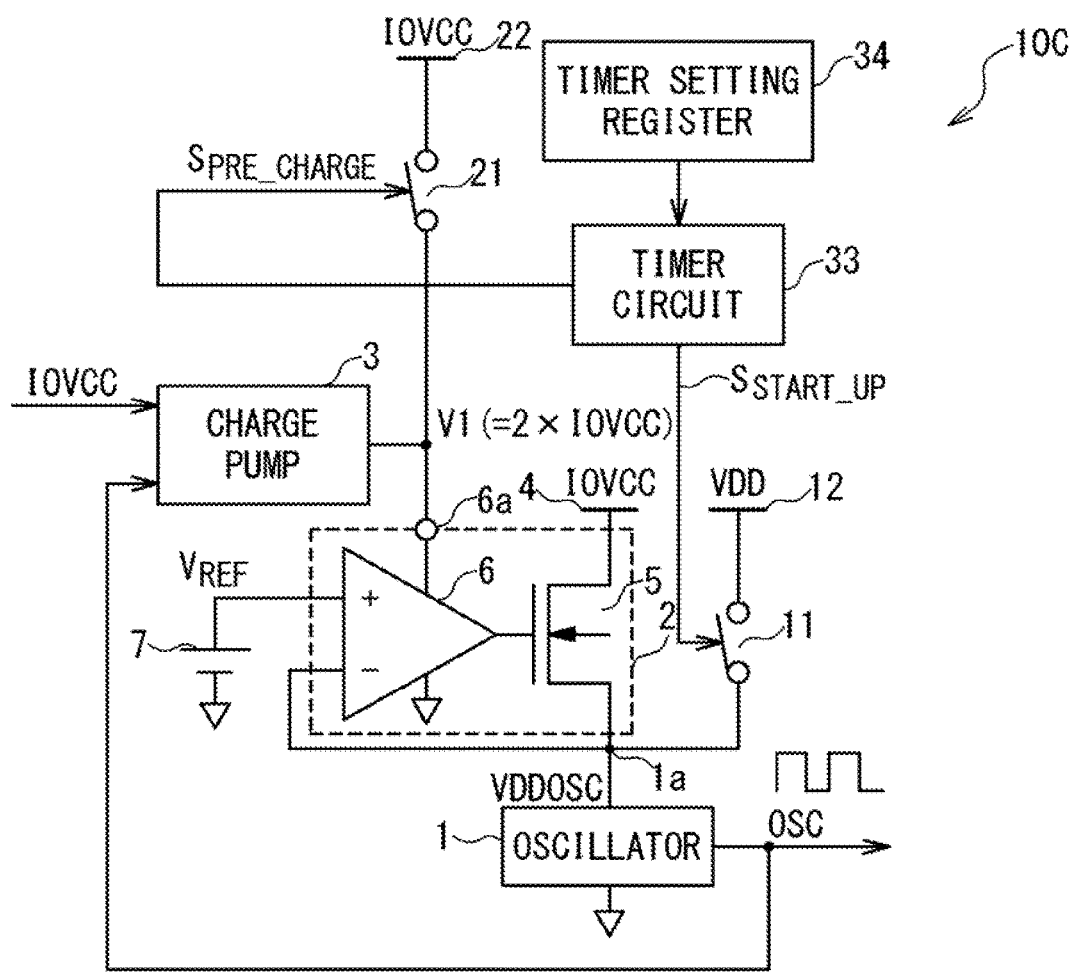
FIG. 12 is a circuit diagram illustrating still another configuration of the oscillator circuit in the fourth embodiment.

In another example, the time counting operation is carried out by the timer circuit and the switches 11 and 21 may be turned off when it is estimated that the voltage level of the boosted power supply voltage V1 supplied to the power terminal 6a of the operational amplifier 6 is sufficiently raised. FIG. 12 is a circuit diagram illustrating the configuration of the oscillator circuit 10C having such a configuration. The oscillator circuit 10C of FIG. 12 has a timer circuit 33 and a timer setting register 34. The timer setting register 34 holds a register value used to set the elapsed time to be detected by the time counting operation by the timer circuit 33.

The oscillator circuit 10C of FIG. 12 operates as follows. When the start-up of an integrated circuit containing the oscillator circuit 10C is started (for example, when the power of the integrated circuit is turned on or the integrated circuit is reset), the timer circuit 33 asserts the start signal $S_{START\_UP}$ and the precharge signal $S_{PRE\_CHARGE}$ to turn on the switches 11 and 21, and starts the time counting operation. Since the switches 11 and 21 are turned on, the oscillator 1, the charge pump 3, the NMOS transistor 5, and the operational amplifier 6 start the operations and the boosted power supply voltage V1 begins to rise, as mentioned above. Moreover, when the time specified by the register value of the timer setting register 34 from the start of the time counting operation elapses, the timer circuit 33 negates the start signal $S_{START\_UP}$ and the precharge signal $S_{PRE\_CHARGE}$ to turn off the switches 11 and 21. Thus, the start-up of the oscillator circuit 10C of FIG. 12 completes.

In the above-mentioned embodiments, the oscillation clock signal OSC generated by the oscillator 1 is supplied to the charge pump 3. However, a clock signal generated from the oscillation clock signal OSC, e.g., a frequency-division clock signal obtained by frequency-dividing the oscillation clock signal OSC may be supplied to the charge pump 3. In this case, the charge pump 3 uses the clock signal generated from the oscillation clock signal OSC (e.g. the frequency-division clock signal) to boost the power supply voltage IOVCC and to generate the boosted power supply voltage V1.

Figure 13:
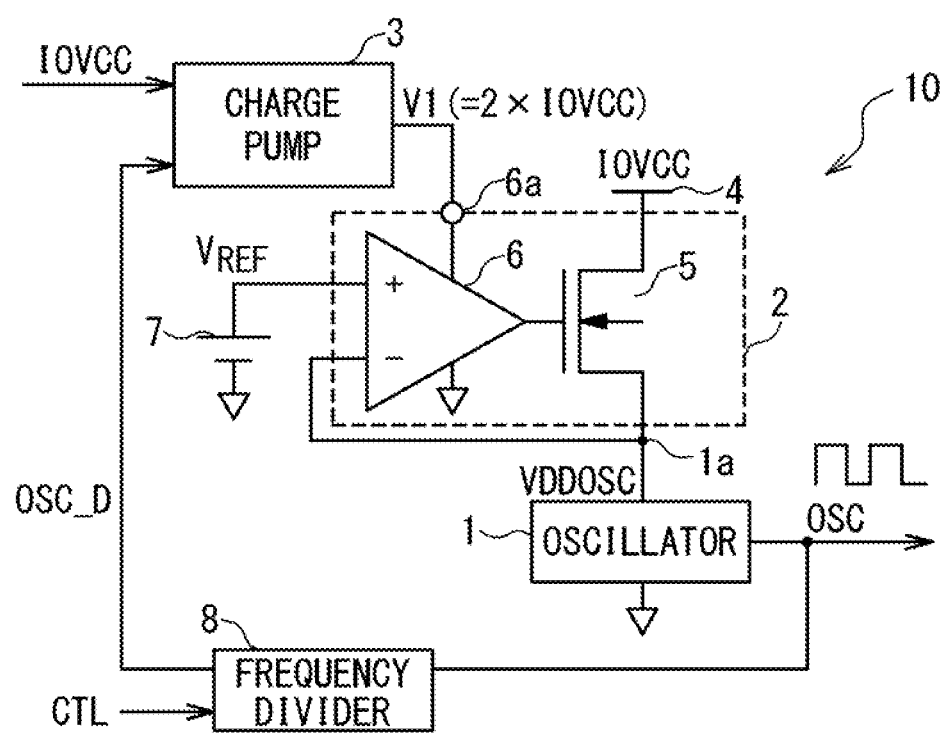
FIG. 13 is a circuit diagram illustrating an example of the configuration of the oscillator circuit in which a frequency division clock signal obtained by frequency-dividing the oscillation clock signal is supplied to a charge pump.

FIG. 13 is a circuit diagram illustrating an example of the configuration in which the frequency-division clock signal obtained by frequency-dividing the oscillation clock signal OSC is supplied to the charge pump 3. The oscillator circuit 10 of FIG. 13 is configured in the same way as the oscillator circuit 10 shown in FIG. 2, but differs in that a frequency-divider 8 is additionally provided. The frequency-divider 8 frequency-divides the oscillation clock signal OSC generated by the oscillator 1 to generate the frequency-division clock signal OSC_D and supplies the frequency-division clock signal OSC_D to the charge pump 3.

In one embodiment, a control signal CTL which is used to control a frequency-division ratio n for the frequency-division of the oscillation clock signal OSC which is carried out by the frequency divider 8 may be supplied to the frequency divider 8. In this case, the frequency-division ratio n is a natural number, and is a parameter defined by the following equation (1), by using the frequency f of the oscillation clock signal OSC and the frequency $f_D$ of the frequency-division clock signal OSC_D:

$$n=f/f_D \qquad (1).$$

For example, in order to raise the boosted power supply voltage V1 quickly immediately after the oscillator circuit 10 is started up, the frequency-division clock signal OSC_D having a higher frequency may be supplied to the charge pump 3. For this purpose, the frequency division ratio n is set low immediately after the oscillator circuit 10 is started up.

Also, after the time elapses sufficiently from the start-up of the oscillator circuit 10, the frequency-division clock signal OSC_D having a lower frequency may be supplied to the charge pump 3 to reduce power consumption. For this purpose, the frequency-division ratio n may be set high after the time elapses sufficiently from the start-up of the oscillator circuit 10.

Figure 14:
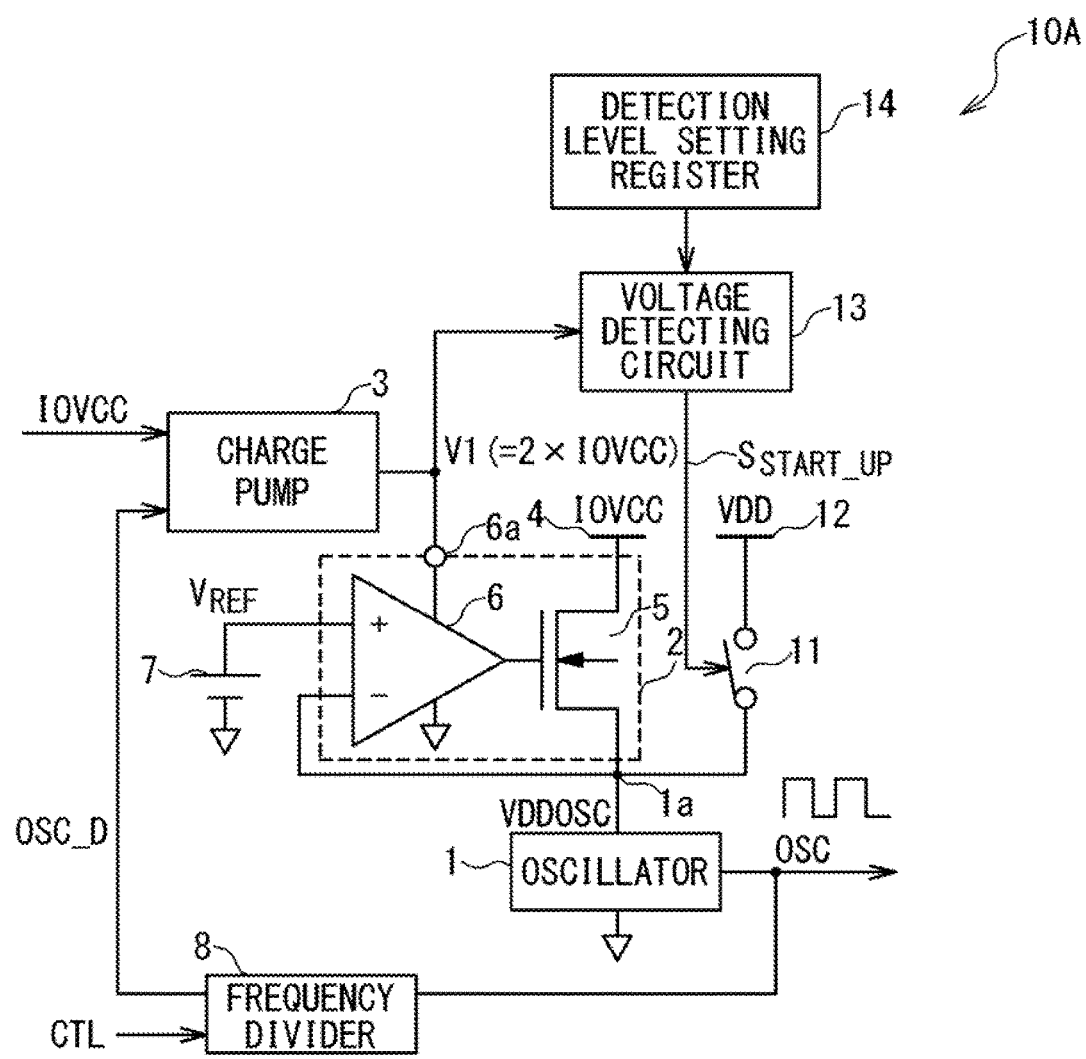
FIG. 14 is a circuit diagram illustrating another example of the configuration of the oscillator circuit in which the frequency division clock signal obtained by frequency-dividing the oscillation clock signal is supplied to the charge pump.
Figure 15:
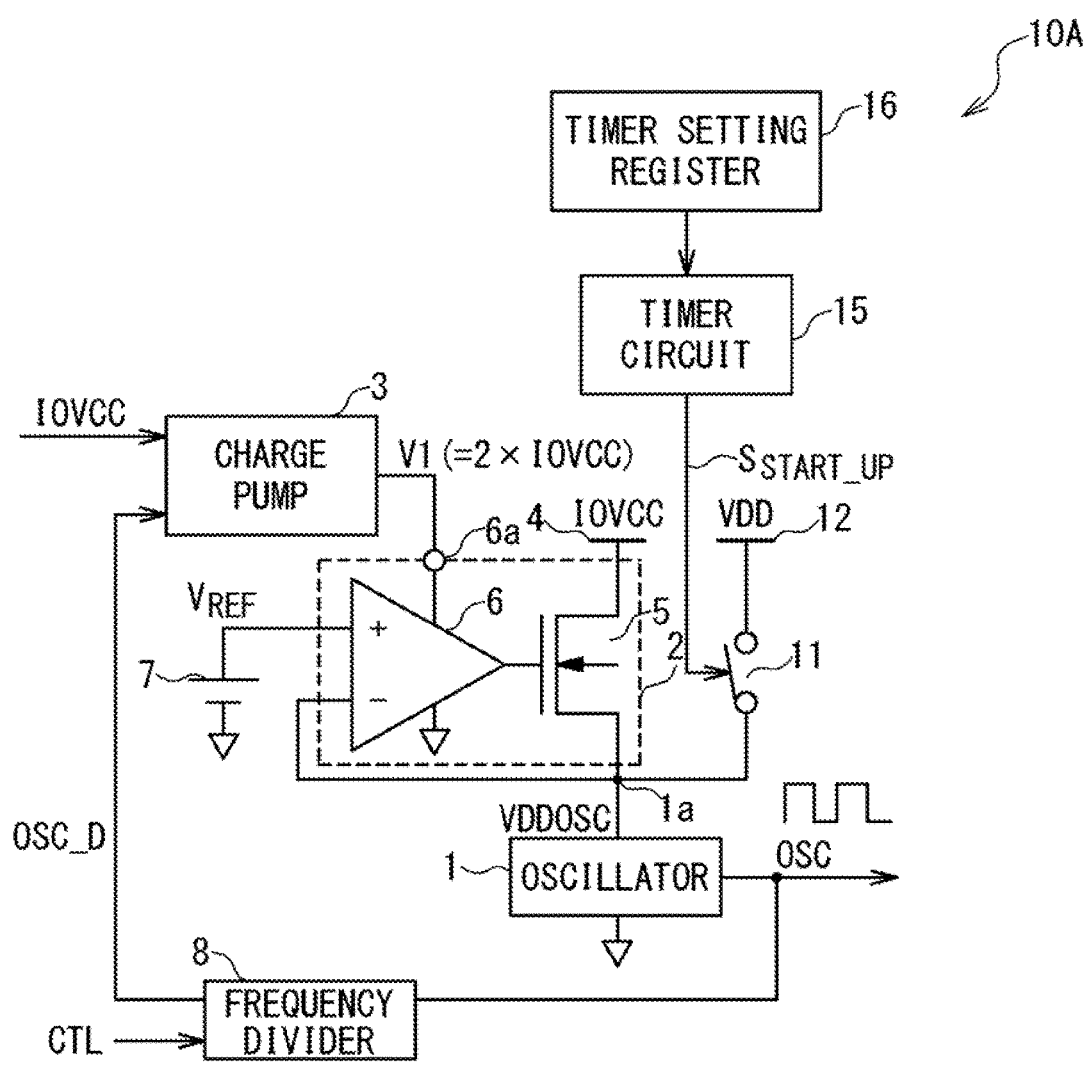
FIG. 15 is a circuit diagram illustrating still another example of the configuration of the oscillator circuit in which the frequency division clock signal obtained by frequency-dividing the oscillation clock signal is supplied to the charge pump.
Figure 16:
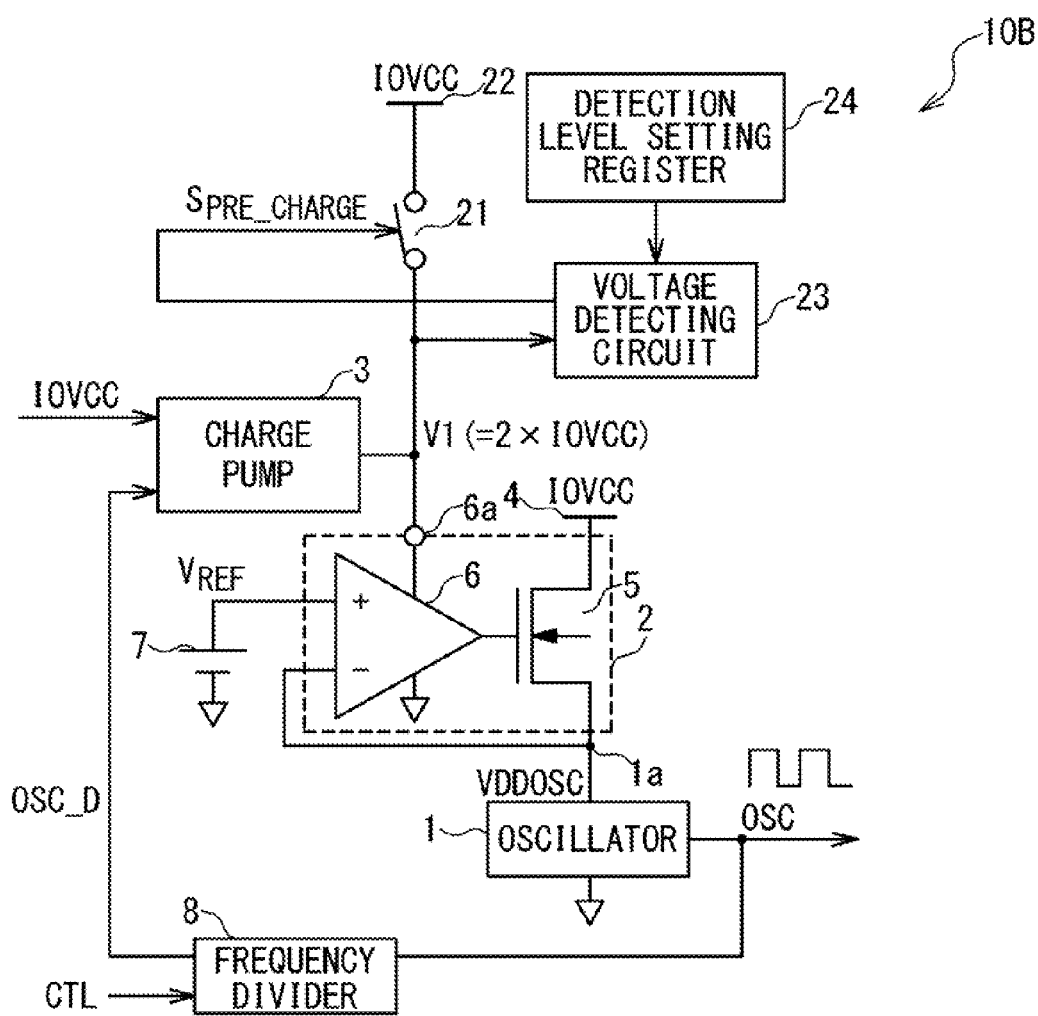
FIG. 16 is a circuit diagram illustrating furthermore another example of the configuration of the oscillator circuit to which a frequency division clock signal obtained by frequency-dividing the oscillation clock signal is supplied to the charge pump.
Figure 17:
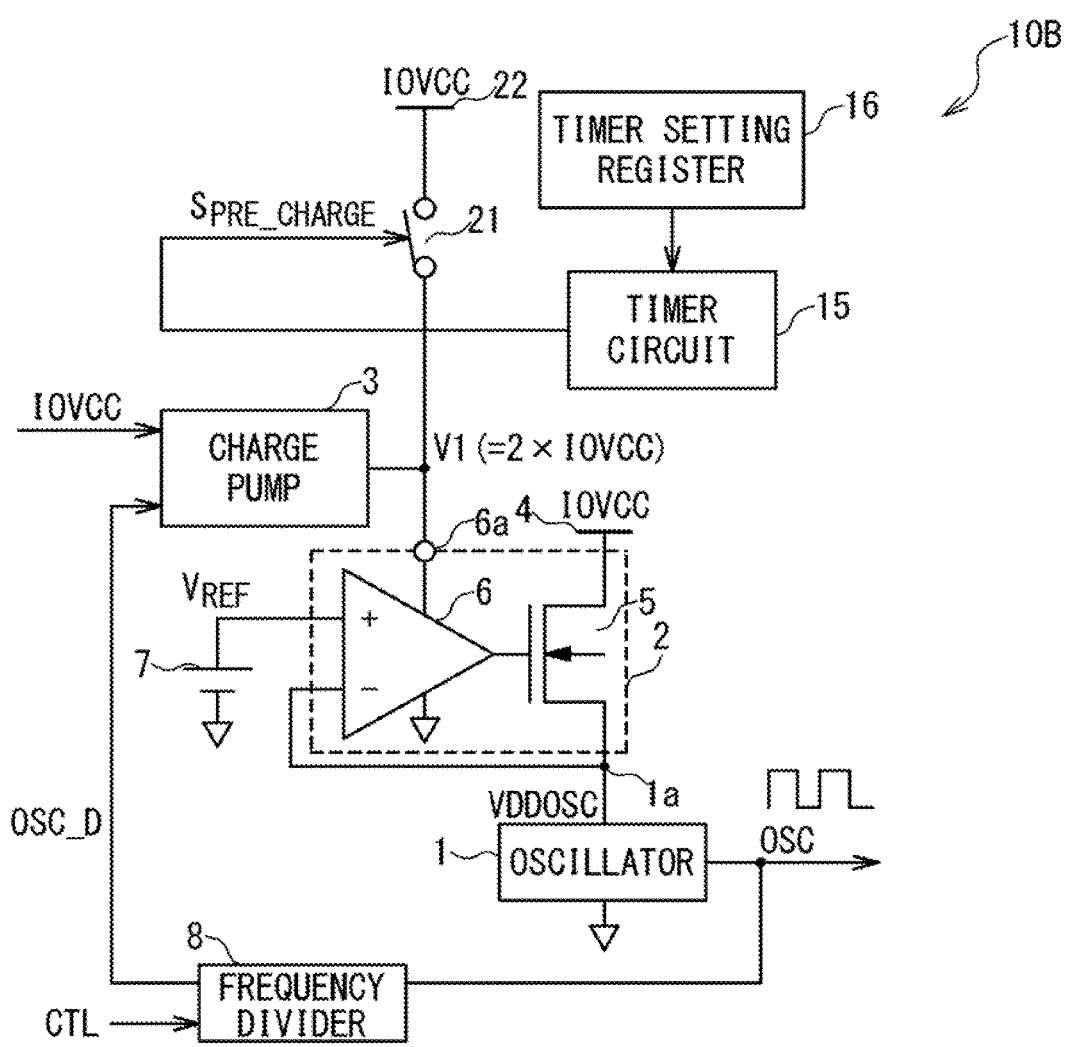
FIG. 17 is a circuit diagram illustrating further still another example of the configuration of the oscillator circuit in which the frequency division clock signal obtained by frequency-dividing the oscillation clock signal is supplied to the charge pump.

The oscillator circuits 10A to 10C described in the second to fourth embodiments may be configured to have the frequency divider 8. FIG. 14 to FIG. 17 are circuit diagrams illustrating examples of the oscillator circuits 10A and 10B configured in this way. FIG. 14 shows the configuration in which the frequency divider 8 is added to the oscillator circuit 10A of FIG. 5. FIG. 15 shows the configuration in which the frequency divider 8 is added to the oscillator circuit 10A of FIG. 6. Also, FIG. 16 shows the configuration in which the frequency divider 8 is added to the oscillator circuit 10B of FIG. 8. FIG. 17 shows the configuration in which the frequency divider 8 is added to the oscillator circuit 10B of FIG. 9.

As mentioned above, the embodiments of the present invention have been specifically described. However, the present invention shall not be construed as being limited to the above-mentioned embodiments. It would be apparent to the skilled person in the art that the present invention can be implemented with various modifications.

What is claimed is:

1. A circuit, comprising:
   an oscillator configured to generate an oscillation clock signal;
   an NMOS transistor having a source connected with a power terminal of the oscillator, and a drain connected with a first power supply line configured to receive a first power supply voltage;
   an operational amplifier configured to control a gate voltage of the NMOS transistor based on a voltage of the power terminal of the oscillator;
   a first switch connected between a second power supply line configured to receive a second power supply voltage and the power terminal of the oscillator; and
   a charge pump configured to:
      generate a boosted power supply voltage by boosting the first power supply voltage using at least one of the oscillation clock signal and a clock signal generated from the oscillation clock signal; and
      supply the boosted power supply voltage to the power terminal of the operational amplifier.

2. The circuit according to claim 1, wherein the first switch is configured to couple the power terminal of the oscillator with the second power supply line based at least in part on a control signal.

3. The circuit according to claim 1, further comprising:
   a controller configured to control the first switch based on a voltage of the power terminal of the operational amplifier.

4. The circuit according to claim 3, further comprising:
   a timer circuit configured to turn on the first switch in response to starting-up an integrated circuit which comprises the circuit, wherein the timer circuit is configured to start a time counting operation and to turn off the first switch when a predetermined time passes from the start of the time counting operation.

5. The circuit according to claim 1, wherein the circuit is an integrated circuit.

6. The circuit according to claim 1, further comprising a second switch connected between a third power supply line configured to receive a third power supply voltage and a power terminal of the operational amplifier.

7. The circuit according to claim 6, wherein the second switch is configured to couple the power terminal of the operational amplifier with the third power supply line based at least in part on a control signal.

8. The circuit according to claim 6, further comprising:
   a controller configured to control the second switch based on the voltage of the power terminal of the operational amplifier.

9. The circuit according to claim 6, further comprising:
   a timer circuit configured to turn on the second switch based on starting-up an integrated circuit which comprises the circuit to start a time counting operation, wherein the timer circuit is configured to turn off the second switch when a predetermined time elapses from the start of the time counting operation.

10. A circuit comprising:
an oscillator configured to generate an oscillation clock signal;
an NMOS transistor having a source connected with a power terminal of the oscillator, and a drain connected with a first power supply line configured to receive a first power supply voltage;
an operational amplifier configured to control a gate voltage of the NMOS transistor based on a voltage of the power terminal of the oscillator;
a first switch connected between a second power supply line configured to receive a second power supply voltage and a power terminal of the operational amplifier; and
a charge pump configured to:
generate a boosted power supply voltage by boosting the first power supply voltage using at least one of the oscillation clock signal and a clock signal generated from the oscillation clock signal; and
supply the boosted power supply voltage to the power terminal of the operational amplifier.

11. The circuit according to claim 10, wherein the first switch is configured to couple the power terminal of the operational amplifier with the second power supply line based at least in part on a control signal.

12. The circuit according to claim 10, further comprising:
a controller configured to control the first switch based on the voltage of the power terminal of the operational amplifier.

13. The circuit according to claim 10, further comprising:
a timer circuit configured to turn on the first switch based on starting-up an integrated circuit which comprises the circuit to start a time counting operation, wherein the timer circuit is configured to turn off the first switch when a predetermined time elapses from the start of the time counting operation.

14. The circuit according to claim 10, wherein the circuit is an integrated circuit.

15. The circuit according to claim 10, further comprising:
a second switch connected between a third power supply line configured to receive a third power supply voltage and the power terminal of the oscillator.

16. The circuit according to claim 15, wherein the second switch is configured to couple the power terminal of the oscillator with the third power supply line based at least in part on a control signal.

17. The circuit according to claim 15, further comprising:
a controller configured to control the second switch based on a voltage of the power terminal of the operational amplifier.

18. The circuit according to claim 15, further comprising:
a timer circuit configured to turn on the second switch in response to starting-up an integrated circuit which comprises the circuit, wherein the timer circuit is configured to start a time counting operation and to turn off the second switch when a predetermined time passes from the start of the time counting operation.

19. A circuit comprising:
an oscillator configured to generate an oscillation clock signal;
an NMOS transistor having a source connected with a power terminal of the oscillator, and a drain connected with a first power supply line configured to receive a first power supply voltage;
an operational amplifier configured to control a gate voltage of the NMOS transistor based on a voltage of the power terminal of the oscillator;
a frequency divider configured to:
frequency-divide the oscillation clock signal to generate a frequency-division clock signal; and
control a frequency division ratio based on a control signal when frequency-dividing the oscillation clock signal; and
a charge pump configured to:
generate a boosted power supply voltage by boosting the first power supply voltage using the frequency-division clock signal; and
supply the boosted power supply voltage to the power terminal of the operational amplifier.

20. The circuit according to claim 19, wherein the circuit is an integrated circuit.

* * * * *